United States Patent
Huang et al.

(10) Patent No.: US 7,923,791 B2
(45) Date of Patent: Apr. 12, 2011

(54) PACKAGE AND PACKAGING ASSEMBLY OF MICROELECTROMECHANICAL SYSTEM MICROPHONE

(75) Inventors: Chao-Ta Huang, Hsinchu (TW); Hsin-Tang Chien, Luodong Town, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 486 days.

(21) Appl. No.: 11/871,147

(22) Filed: Oct. 11, 2007

(65) Prior Publication Data

US 2008/0283942 A1    Nov. 20, 2008

(30) Foreign Application Priority Data

May 15, 2007 (TW) .............................. 96117299 A

(51) Int. Cl.
*H01L 29/84* (2006.01)

(52) U.S. Cl. ........ 257/415; 257/416; 257/252; 257/254; 257/686; 257/E23.18; 257/E29.324

(58) Field of Classification Search .................. 257/659, 257/686, 704, 710, 777, E23.114, E23.177, 257/E23.189, E23.193, 252, 254, 415, 416, 257/E23.18, E29.166, E29.324

See application file for complete search history.

(56) References Cited

U.S. PATENT DOCUMENTS

| 5,408,534 A | 4/1995 | Lenzini et al. |
| 5,740,261 A | 4/1998 | Loeppert et al. |
| 5,889,872 A | 3/1999 | Sooriakumar et al. |
| 6,075,867 A | 6/2000 | Bay et al. |
| 6,088,463 A | 7/2000 | Rombach et al. |
| 6,178,249 B1 | 1/2001 | Hietanen et al. |
| 6,420,203 B1 | 7/2002 | Okawa et al. |
| 6,522,762 B1 | 2/2003 | Mullenborn et al. |

(Continued)

FOREIGN PATENT DOCUMENTS

CN 1926919 3/2007

(Continued)

OTHER PUBLICATIONS

"Office Action of Taiwan counterpart application", issued on Oct. 7, 2009, p. 1-p. 6.

*Primary Examiner* — A. Sefer
*Assistant Examiner* — Ermias Woldegeorgis
(74) *Attorney, Agent, or Firm* — Jianq Chyun IP Office

(57) ABSTRACT

A package of a MEMS microphone is suitable for being mounted on a printed circuit board. The package includes a substrate, at least one MEMS microphone, and a conductive sealing element. The MEMS microphone is arranged on the substrate, and electrically connected to a conductive layer on a bottom surface of the substrate. The conductive sealing element is arranged on the substrate and around the MEMS microphone for connecting the printed circuit board, and constructs an acoustic housing with the printed circuit board and the substrate. The acoustic housing has at least one acoustic hole passing through the substrate. The acoustic hole has a metal layer on the inner wall thereof for connecting the conductive layer on the bottom surface of the substrate to another conductive layer on the top surface of the substrate.

12 Claims, 2 Drawing Sheets

U.S. PATENT DOCUMENTS

| | | |
|---|---|---|
| 6,594,369 B1 | 7/2003 | Une |
| 6,654,473 B2 | 11/2003 | Collins |
| 6,732,588 B1 | 5/2004 | Mullenborn et al. |
| 6,781,231 B2 | 8/2004 | Minervini |
| 6,924,429 B2 | 8/2005 | Kasai et al. |
| 6,928,178 B2 | 8/2005 | Chang |
| 7,202,552 B2 * | 4/2007 | Zhe et al. ............ 257/659 |
| 2005/0018864 A1 | 1/2005 | Minervini |
| 2005/0185182 A1 | 8/2005 | Raab et al. |
| 2005/0189622 A1 * | 9/2005 | Humpston et al. ............ 257/659 |
| 2005/0189635 A1 * | 9/2005 | Humpston et al. ............ 257/678 |
| 2006/0169049 A1 * | 8/2006 | Matsubara ............ 73/754 |
| 2007/0189558 A1 * | 8/2007 | Ogura et al. ............ 381/191 |
| 2008/0197485 A1 * | 8/2008 | Theuss et al. ............ 257/723 |

FOREIGN PATENT DOCUMENTS

| | | |
|---|---|---|
| JP | 2007-60389 | 3/2007 |
| WO | 2005/086532 | 9/2005 |

* cited by examiner

PACKAGE AND PACKAGING ASSEMBLY OF MICROELECTROMECHANICAL SYSTEM MICROPHONE

CROSS-REFERENCE TO RELATED APPLICATION

This application claims the priority benefit of Taiwan application serial no. 96117299, filed May 15, 2007. All disclosure of the Taiwan application is incorporated herein by reference.

BACKGROUND OF THE INVENTION

1. Field of the Invention

The present invention relates to a microelectromechanical system (MEMS) microphone. More particularly, the present invention relates to a package and a packaging assembly of the MEMS microphone.

2. Description of Related Art

Along with the increasing demands for mobile phones, requirements on acoustic quality of mobile phones, and maturity of hearing aid technology, the demands for high-quality mini-microphone are rapidly growing. Capacitor microphones which are fabricated by MEMS technology have advantages of light weight, small volume, and good signal quality, so MEMS microphones have gradually become mainstream products of the mini-microphone.

A "Microelectromechanical system package with environmental and interference shield" has been disclosed in U.S. Pat. No. 6,781,231, which includes a MEMS microphone, a substrate, and a cover. The substrate has a surface for carrying the MEMS microphone. The cover includes a conductive layer having a central portion and a peripheral portion around the central portion. The peripheral portion of the cover is connected to the substrate to form a housing. The central portion of the cover and the substrate are separated by a space for accommodating the MEMS microphone. The housing has an acoustic hole to allow acoustic signals to reach the MEMS microphone.

SUMMARY OF THE INVENTION

Accordingly, the present invention is directed to a package for a MEMS microphone, suitable for being mounted on the printed circuit board and converting an acoustic signal to an electronic signal.

The present invention is directed to a packaging assembly of a MEMS microphone, for converting the acoustic signal to the electronic signal.

The present invention provides a package of a MEMS microphone including a substrate, a MEMS microphone, a sealing element, and at least a conductive connecting element. The substrate has at least a conductive layer and at least a dielectric layer disposed on the substrate. The MEMS microphone is arranged on a bottom surface of the substrate, and is electrically connected to the conductive layer of the substrate. The sealing element is arranged on the bottom surface of the substrate and around the MEMS microphone. The conductive connecting element is arranged on the bottom surface of the substrate. When the substrate is mounted on a printed circuit board by the sealing element and the conductive connecting element, the sealing element, the printed circuit board, and the substrate construct an acoustic housing, and the acoustic housing has at least an acoustic hole.

The present invention further provides a package of a MEMS microphone including a substrate, a MEMS microphone, a conductive sealing element, at least a conductive connecting element, and at least an acoustic hole. The substrate has at least a conductive layer and at least a dielectric layer disposed on the substrate. The MEMS microphone is disposed on a bottom surface of the substrate, and is electrically connected to the conductive layer of the substrate. The conductive sealing element is arranged on the bottom surface of the substrate, electrically connected to the conductive layer on the bottom surface of the substrate, and around the MEMS microphone. The conductive connecting element is arranged on the bottom surface of the substrate. The acoustic hole is arranged on the substrate, the acoustic hole has a metal layer on an inner wall thereof, and the acoustic hole passes through the substrate and is connected to the conductive layer of the substrate. When the substrate is mounted on a printed circuit board by the conductive sealing element and the conductive connecting element, the conductive sealing element is electrically connected to a conductive layer of the printed circuit board, and constructs an acoustic housing with the printed circuit board and the substrate.

The present invention further provides a packaging assembly of a MEMS microphone including a substrate, a MEMS microphone, a sealing element, at least a conductive connecting element, and a printed circuit board. The substrate has at least one first conductive layer and at least a dielectric layer disposed on the substrate. The MEMS microphone is arranged on a bottom surface of the substrate and electrically connected to the first conductive layer of the substrate. The sealing element is arranged on the bottom surface of the substrate and around the MEMS microphone. The conductive connecting element is arranged on the bottom surface of the substrate. The printed circuit board includes a second conductive layer. When the printed circuit board is connected with the substrate through the sealing element and the conductive connecting element, the sealing element, the printed circuit board, and the substrate construct an acoustic housing, and the acoustic housing has at least an acoustic hole.

The present invention further provides a packaging assembly of a MEMS microphone including a substrate, a MEMS microphone, a conductive sealing element, at least a conductive connecting element, at least an acoustic hole, and a printed circuit board. The substrate has at least a first conductive layer and at least a dielectric layer disposed on the substrate. The MEMS microphone is disposed on a bottom surface of the substrate and electrically connected to the first conductive layer of the substrate. The conductive sealing element is arranged on the bottom surface of the substrate, and is electrically connected to the first conductive layer on the bottom surface of the substrate and around the MEMS microphone. The conductive connecting element is arranged on the bottom surface of the substrate. The acoustic hole is arranged on the substrate, the acoustic hole has a metal layer on an inner wall thereof, and the acoustic hole passes through the substrate and is connected to the first conductive layer of the substrate. The printed circuit board includes a second conductive layer. When the substrate is mounted on the printed circuit board through the conductive sealing element and the conductive connecting element, the conductive sealing element is electrically connected to the second conductive layer of the printed circuit board, and constructs an acoustic housing with the printed circuit board and the substrate.

In the present invention, a substrate is used to carry the MEMS microphone, and the conductive sealing element is used to connect the substrate to the printed circuit board. The conductive sealing element, the substrate, and the printed circuit board form an acoustic housing and an electromagnetic interference shield to accommodate the MEMS microphone and the integrated circuit chip (IC chip) therein.

In order to make the aforementioned and other features and advantages of the present invention comprehensible, an embodiment accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate an embodiment of the invention and, together with the description, serve to explain the principles of the invention.

DESCRIPTION OF EMBODIMENTS

Figure 1:
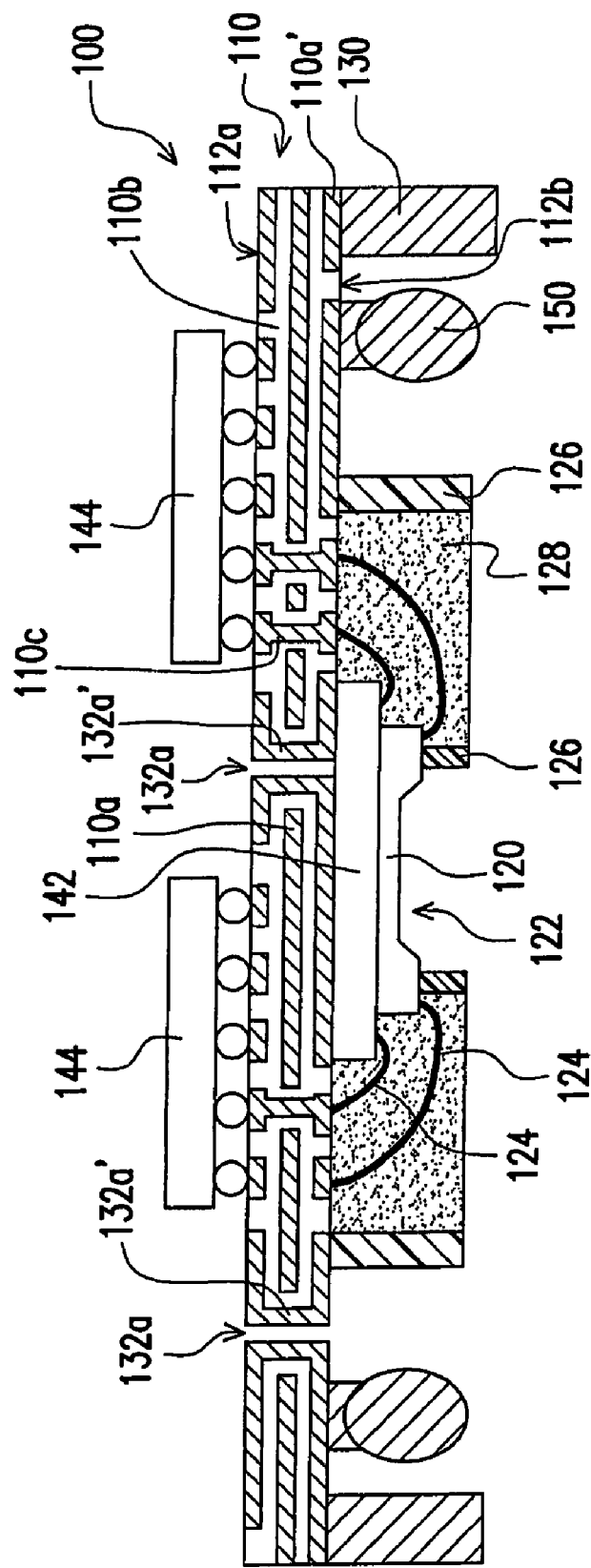
FIG. 1 is a cross-sectional view of a package of a MEMS microphone according to an embodiment of the present invention.
Figure 2:
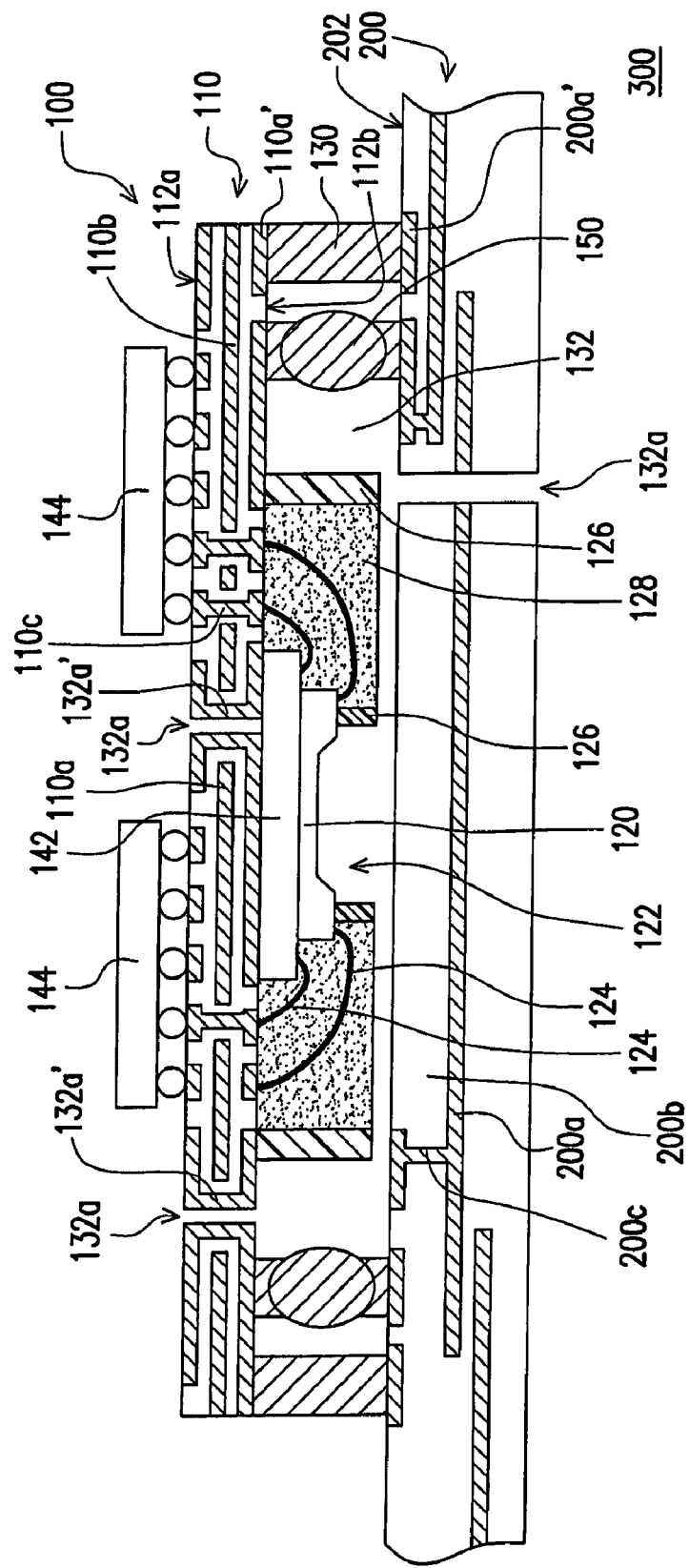
FIG. 2 is a partial cross-sectional view of the package of the MEMS microphone of FIG. 1 when being mounted on the printed circuit board.

FIG. 1 is a cross-sectional view of a package of a MEMS microphone according to an embodiment of the present invention, and FIG. 2 is a partial cross-sectional view of the package of the MEMS microphone of FIG. 1 when being mounted on the printed circuit board. Referring to FIGS. 1 and 2, the package of the MEMS microphone (hereafter referred to as the package) 100 of this embodiment is suitable for being mounted on a printed circuit board 200. The printed circuit board 200 includes a plurality of conductive layers 200a, a plurality of dielectric layers 200b stacked alternately with the conductive layers 200a, and a plurality of conductive vias 200c passing through the dielectric layers 200b and electrically connected to the conductive layers 200a.

The package 100 includes a substrate 110, and the substrate 110 can adopt a multi-layer substrate fabricated by FR-4 substrate lamination or ceramic substrate lamination process, and includes a plurality of conductive layers 110a, a plurality of dielectric layers 110b stacked alternately with the conductive layers 110a, and a plurality of conductive vias 110c passing through the dielectric layer 110b and electrically connected to the conductive layers 110a. The conductive layer 110a and the conductive vias 110c construct a conductive circuit of the substrate 110.

The package 100 further includes a MEMS microphone 120 that is arranged on the bottom surface 112b opposite to the top surface 112a of the substrate 110, and has an acoustic pressure receiving surface 122. In this embodiment, the MEMS microphone 120 can be adhered on the substrate 110, and is electrically connected to the substrate 110 by means of wire bonding. When the MEMS microphone 120 is electrically connected to the substrate 110 through a plurality of wires 124, two dam bars 126 can be formed on the substrate 110 and the MEMS microphone 120 respectively by an encapsulation process, and an encapsulant 128 is formed in the scope surrounded by the dam bars 126, so as to protect the MEMS microphone 120 and the wires 124.

The package 100 further includes a conductive sealing element 130 that is arranged on the bottom surface 112b of the substrate 110, and around the MEMS microphone 120 for connecting the printed circuit board 200. In this embodiment, the conductive sealing element 130 is, for example, a metal ring, a conductive adhesive ring, or a solder ring, in which the metal ring includes copper ring, and the solder ring can be formed by screen printing and solder reflowing processes. Two top and bottom sides of the conductive sealing element 130 respectively connect a pad 110a' constructed by the conductive layer 110a on the bottom surface 112b of the substrate 110 and a pad 200a' constructed by the conductive layer 200a of the surface 202 of the printed circuit board 200. The shape of the conductive sealing element 130 can be circle, square, or polygon.

When the substrate 110 is mounted on the printed circuit board 200 through the conductive sealing element 130, the conductive sealing element 130, the printed circuit board 200, and the substrate 110 construct an acoustic housing 132. The acoustic housing 132 has a plurality of acoustic holes 132a passing through the substrate 110 and the printed circuit board 200 respectively. In addition, the acoustic holes 130a can be formed in the substrate 110 and the printed circuit board 200 by drilling. In this embodiment, the acoustic hole 132a has a metal layer 132a' on an inner wall thereof, passes through the substrate 110, and is connected to the conductive layer 110a on the top surface 112a and the conductive layer 110a on the bottom surface 112b of the substrate 110, so as to achieve a heat dissipation effect.

The package 100 further includes an IC chip 142 arranged on the substrate 110 and electrically connected to the substrate 110. The MEMS microphone 120 can be disposed on the IC chip 142, i.e. indirectly disposed on the substrate 110 through being directly disposed on the IC chip 142. In this embodiment, the MEMS microphone 120 can be adhered on the IC chip 142, and the IC chip 142 can be electrically connected to the substrate 110 by means of wire bonding. In another embodiment (not shown), the IC chip 142 can be electrically connected to the MEMS microphone 120 by means of wire bonding.

The package 100 can further include a plurality of IC chips 144 arranged on the substrate 110 and outside the acoustic housing 132. In this embodiment, the IC chip 144 can be electrically connected to the substrate 110 by means of flip chip bonding.

The package 100 can further include a plurality of conductive connecting elements 150, which are arranged on the substrate 110 for electrically connecting the pads of the substrate 110 to the pads of the printed circuit board 200. In this embodiment, the conductive connecting elements 150 can be metal balls, for example, solder balls formed by solder-ball implantation process, and the conductive connecting elements 150 can also be metal leads, for example, copper leads.

When the substrate 110 is connected to the printed circuit board 200 through the conductive sealing element 130 and the conductive connecting elements 150, the conductive sealing element 130, the package 100, and the printed circuit board 200 construct a packaging assembly 300 of MEMS microphone. In addition, the conductive layer 110a of the substrate 110, the conductive layer 200a of the printed circuit board 200, the conductive sealing element 130 and the connecting elements 150 can form a shield for preventing electromagnetic interference to the MEMS microphone 120 and the IC chip 142.

To sum up, in the present invention, the substrate is used to carry the MEMS microphone, and the substrate is connected to the printed circuit board through the conductive sealing element and the conductive connecting elements. The conductive sealing element, the substrate, and the printed circuit board form an acoustic housing and an electromagnetic interference shield to accommodate the MEMS microphone and the IC chip therein. Therefore, the present invention can package the MEMS microphone, and can be used in conjunction with the printed circuit board to provide the acoustic housing to the MEMS microphone, so as to facilitate the MEMS microphone to convert the acoustic signal to the electronic signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package of a MEMS microphone, comprising:
    a substrate having at least a conductive layer and at least a dielectric layer disposed on the substrate;
    a MEMS microphone disposed on a bottom surface of the substrate, and electrically connected to the conductive layer of the substrate;
    a conductive sealing element arranged on the bottom surface of the substrate, electrically and directly connected to the conductive layer on the bottom surface of the substrate, physically apart from the MEMS microphone, and surrounding the MEMS microphone;
    at least a conductive connecting element arranged on the bottom surface of the substrate and physically apart from the conductive sealing element and the MEMS microphone, and surrounded by the conductive sealing element; and
    at least an acoustic hole arranged on the substrate, wherein the acoustic hole has a metal layer on an inner wall thereof, and the acoustic hole passes through the substrate and is connected to the conductive layer of the substrate,
    wherein when the substrate is mounted on a printed circuit board by the conductive sealing element and the conductive connecting element, the conductive sealing element is electrically and directly connected to a conductive layer of the printed circuit board to construct an acoustic housing enclosing the MEMS microphone and the conductive connecting element.

2. The package of the MEMS microphone as claimed in claim 1, wherein the substrate further comprises:
    at least a via arranged in the substrate.

3. The package of the MEMS microphone as claimed in claim 2, wherein the metal layer is disposed on the entire surface of the inner wall, and is connected to the conductive layer on the bottom surface and another conductive layer of the substrate on a top surface of the substrate.

4. The package of the MEMS microphone as claimed in claim 1, further comprising:
    at least an IC chip disposed on the bottom surface of the substrate, electrically connected to the substrate, and located in the acoustic housing, wherein the MEMS microphone is disposed on the IC chip, and is electrically connected to the IC chip or electrically connected to the conductive layer of the substrate.

5. The package of the MEMS microphone as claimed in claim 1, further comprising:
    at least an IC chip arranged on the bottom surface of the substrate, electrically connected to the substrate, and located in the acoustic housing, wherein the MEMS microphone is disposed on the bottom surface of the substrate, and is electrically connected to the IC chip or electrically connected to the conductive layer of the substrate.

6. The package of the MEMS microphone as claimed in claim 1, further comprising:
    at least an IC chip arranged on the bottom surface of the substrate or a top surface of the substrate opposite to the bottom surface, electrically connected to the conductive layer of the substrate, and located outside the acoustic housing.

7. A packaging assembly of a MEMS microphone, comprising:
    a substrate having at least a first conductive layer and at least a dielectric layer disposed on the substrate;
    a MEMS microphone disposed on a bottom surface of the substrate and electrically connected to the first conductive layer of the substrate;
    a conductive sealing element arranged on the bottom surface of the substrate, electrically and directly connected to the first conductive layer on the bottom surface of the substrate, physically apart from the MEMS microphone, and surrounding the MEMS microphone;
    at least a conductive connecting element arranged on the bottom surface of the substrate and physically apart from the conductive sealing element and the MEMS microphone, and surrounded by the conductive sealing element;
    at least an acoustic hole arranged on the substrate, wherein the acoustic hole has a metal layer on an inner wall thereof, and the acoustic hole passes through the substrate and is connected to the first conductive layer of the substrate; and
    a printed circuit board comprising a second conductive layer,
    wherein when the substrate is mounted on the printed circuit board through the conductive sealing element and the conductive connecting element, the conductive sealing element is electrically and directly connected to the second conductive layer of the printed circuit board to construct an acoustic housing enclosing the MEMS microphone and the conductive connecting element.

8. The packaging assembly of the MEMS microphone as claimed in claim 7, wherein the substrate further comprises:
    at least a via arranged in the substrate.

9. The packaging assembly of the MEMS microphone as claimed in claim 8, wherein the metal layer is disposed on the entire surface of the inner wall, and is connected to the first conductive layer on the bottom surface and another first conductive layer of the substrate on a top surface of the substrate.

10. The packaging assembly of the MEMS microphone as claimed in claim 7, further comprising:
    at least an IC chip arranged on the bottom surface of the substrate, electrically connected to the substrate, and located in the acoustic housing, wherein the MEMS microphone is disposed on the IC chip, and is electrically connected to the IC chip or electrically connected to the first conductive layer on the bottom surface of the substrate.

11. The packaging assembly of the MEMS microphone as claimed in claim 7, further comprising:
    at least an IC chip arranged on the bottom surface of the substrate, electrically connected to the substrate, and located in the acoustic housing, wherein the MEMS microphone is disposed on the bottom surface of the substrate, and is electrically connected to the IC chip or electrically connected to the first conductive layer of the substrate.

12. The packaging assembly of the MEMS microphone as claimed in claim 7, further comprising:
    at least an IC chip arranged on the bottom surface of the substrate or a top surface of the substrate opposite to the bottom surface, electrically connected to the first conductive layer of the substrate, and located outside the acoustic housing.

* * * * *